(12) United States Patent
Liang et al.

(10) Patent No.: US 6,856,156 B2
(45) Date of Patent: Feb. 15, 2005

(54) AUTOMATICALLY ADJUSTABLE WAFER PROBE CARD

(75) Inventors: Sheng-Hui Liang, Hsinchu Hsien (TW); Chine-Gie Lou, Hsinchu Hsien (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/400,758

(22) Filed: Mar. 26, 2003

(65) Prior Publication Data

US 2004/0189332 A1 Sep. 30, 2004

(51) Int. Cl.⁷ .............................................. G01R 31/02
(52) U.S. Cl. ..................... 324/758; 324/754; 324/158.1
(58) Field of Search ................................ 324/758, 754, 324/765, 762, 761, 763, 72.5, 158.1; 439/482, 700; 29/892; 714/724, 719; 438/14, 17, 18

(56) References Cited

U.S. PATENT DOCUMENTS

| | | | | |
|---|---|---|---|---|
| 3,891,924 A | * | 6/1975 | Ardezzone et al. | .......... 324/762 |
| 4,055,805 A | * | 10/1977 | Ardezzone | .................. 324/756 |
| 4,471,298 A | * | 9/1984 | Frohlich | ..................... 324/72.5 |
| 6,636,063 B2 | * | 10/2003 | Arnold et al. | .............. 324/762 |

* cited by examiner

Primary Examiner—David Zarneke
Assistant Examiner—Jimmy Nguyen
(74) Attorney, Agent, or Firm—Tung & Associates

(57) ABSTRACT

An automatically adjustable wafer probe card for the testing of integrated circuits fabricated on a wafer. The wafer probe card includes a pitch shift assembly having a shift block that includes a reserve needle block and an adjacent functional needle block. Multiple probe needles are linearly adjustable on the shift block, and a selected number of the probe needles can be shifted from the reserve needle block to the functional needle block depending on the number of contact pads on the integrated circuit to be contacted by the probe needles of the wafer probe card during the testing process. A selected spacing between the probe needles, or pitch, can be achieved by locating the probe needles at the selected spacings from each other along the functional needle block.

17 Claims, 4 Drawing Sheets

AUTOMATICALLY ADJUSTABLE WAFER PROBE CARD

FIELD OF THE INVENTION

The present invention relates to wafer probe cards used in testing electrical characteristics of integrated circuits fabricated on a semiconductor wafer substrate. More particularly, the present invention relates to a wafer probe card having a probe needle number and probe needle pitch that are automatically selectable to accommodate test keys of various design.

BACKGROUND OF THE INVENTION

A conventional method used by the semiconductor industry in the manufacturing of semiconductor integrated circuits includes the steps of fabrication, wafer sort, assembly and test, respectively. As shown in FIG. 1, in the fabrication step, as many as several thousand dies (integrated circuits) 5 are formed onto a semiconductor wafer 4. In the wafer sort step, each of the dies 5 on the wafer 4 is tested to determine its electrical characteristics and operability, and defective dies are distinguished from operable dies. The defective dies are often marked by an ink mark at the wafer sorting step. In the assembly step, the unmarked, operable dies are assembled into a package, and in the test step, the packaged integrated circuits are tested for operability and reliability.

At the wafer sort step, the dies are tested to establish which dies on the wafer function properly. Each die is tested to all functional product specifications for both DC and AC parameters. Four testing objectives are pursued: (1) chip functionality, in which all chip functions are tested to ensure that only fully-functional chips are assembled and packaged in subsequent steps; (2) chip sorting, in which chips are separated or sorted on the basis of their operating speed performance under various voltage and timing conditions; (3) fab yield response, which yields important information that may lead to improvements in the overall fabrication process; and (4) test coverage, in which high test coverage of the internal device nodes is achieved at the lowest possible cost. The wafer sort procedure is similar to the in-line parametric test except that every die on the wafer is tested, in many cases using the same automated test equipment (ATE). Furthermore, the wafer sort procedure is usually located in a separate facility under less stringent purity conditions than those in which the parametric test is carried out, since wafer fabrication is essentially complete.

In automated wafer handling during wafer sort, a correlation wafer is used to verify tester setup. The correlation wafer is a control wafer the functionality of which has been verified and ensures that the testing system is working properly. After indexing from the cassette to the prober, the wafers are mounted on a vacuum chuck with Z (vertical) positioning. Using software, mechanical probe needles are aligned and contacted with bond pads on the wafer to establish electrical communication between the testing equipment and the dies on the wafer. The probes are interfaced with the ATE to perform the range of AC functional tests based on test algorithms. The type, number and order of tests are defined by the test program.

After testing, die found to be defective are labeled in a computer database to exclude the die from subsequent packaging steps. The labeling method is typically performed by placing a drop of ink on each unacceptable die. Because the ink marking process can be messy and introduce possible contaminants onto the chip, electronic wafer maps are increasingly being used to create a computer image of chip location and test results to categorize good and bad die on the wafer. At the chip assembly stations, the electronic wafer maps are downloaded into an equipment database to ensure that defective chips will not be packaged.

As further shown in FIG. 1, in an integrated circuit pattern of each dice 5, the input, output, power supply and other terminals of the circuit are formed by multiple metalized contact pads 6, adjacent ones of which are usually deployed in lines along the periphery or margins of the pattern in what is commonly known in the art as a test key pattern. Metal lines or traces 7 electrically connect the contact pads 6 to the circuit elements of the dice 5. The outline of the test key pattern is either square or rectangular, and the marginal locations of the contact pads thereon depend on the circuit configuration and the available marginal space. Thus, in a relatively simple circuit pattern, all of the marginal space may be available for contact pads, whereas in more complex circuits, portions of the circuit may invade the marginal areas so that contact pad placement is restricted to the free marginal areas. In some instances, therefore, the contact pads may lie in more or less uniform rows along the margins, and in other cases, the contact pads may be randomly spaced from each other.

Immediately following manufacture of the IC, the electrical characteristics of the device must be tested using a test probe assembly which includes a test probe card consisting of a printed circuit board having an opening therein to provide access to an IC pattern. The opening is surrounded by a ring of conductive pads connected by the printed circuit card to terminals for connection to test equipment appropriate for testing the circuit. The number of pads in the ring determines the maximum capacity of the probe card.

A higher degree of integration in recent semiconductor devices has led to an increase in the number of electrodes in ICs and to a decrease in the size of the electrode pads which are contacted by the probe needles. The reduction in size and increase in density of the probe needles has inevitably made the manufacture and mounting of the needles on the probe card troublesome. The tips of the probe needles are ideally all disposed at the same height level and same angle, but these and other parameters of the needles fluctuate somewhat for a number of reasons. These variations in probe needle parameters reduce test precision and reliability.

The effectiveness, reliability and repeatability of IC testing using a probe card depends on a number of factors and characteristics of the probe card, and particularly the probe needles, including size, alignment, leakage, contact resistance and the force applied by the needles. For this reason, each probe card is usually designed for a particular test key pattern on a wafer having a specific pitch and number of contact pads to be tested, and each probe card is typically incompatible with other test key patterns. Consequently, fabrication of chips having various test key patterns requires that a probe card that matches each test key pattern be designed and manufactured to fit that pattern before those chips can tested. This probe card design and manufacture process is inconvenient and may introduce a delay of up to several weeks into the chip fabrication process. Accordingly, an automatically adjustable wafer probe card is needed which is capable of automatically adjusting to the characteristics of a particular test key pattern on a chip, including the number, pitch and height of the probe needles on the probe card.

Accordingly, an object of the present invention is to provide a probe card which is capable of accommodating dies having a variety of test key patterns.

Another object of the present invention is to provide a probe card having multiple probe needles the number of which may be selected for a particular application depending upon the number of contact pads to be tested on an integrated circuit.

Still another object of the present invention is to provide a probe card having multiple probe needles, the pitch of which may be automatically adjusted depending on the test key pattern or contact pad spacing or configuration on an integrated circuit.

Yet another object of the present invention is to provide a probe card having multiple probe needles, the height of which may be automatically adjusted for a particular application.

A still further object of the present invention is to provide a probe card which prevents the need to fabricate multiple test cards for the testing of integrated circuits having various test key layouts.

Another object of the present invention is to provide an automatically adjustable wafer probe card which includes multiple probe needles that are mounted for linear adjustment along a pitch shift track to facilitate selection of a desired number of probe needles as well as the pitch, or spacing between probe needles, for the testing of integrated circuits fabricated on a wafer.

SUMMARY OF THE INVENTION

In accordance with these and other objects and advantages, the present invention is generally directed to an automatically adjustable wafer probe card for the testing of integrated circuits fabricated on a wafer. The wafer probe card includes a pitch shift assembly having a shift block that includes a reserve needle block and an adjacent functional needle block, both of which are provided on the bottom surface of the wafer probe card. Multiple probe needles are linearly adjustable on the shift block, and a selected number of the probe needles can be shifted from the reserve needle block to the functional needle block depending on the number of contact pads on the integrated circuit to be contacted by the probe needles of the wafer probe card during the testing process. A selected spacing between the probe needles, or pitch, can be achieved by locating the probe needles at the selected spacings from each other along the functional needle block. The functional needle block may be hingedly mounted on the wafer probe card, in which case a block adjusting motor that engages the functional needle block is capable of pivoting the functional needle block away from the card to achieve a selected height of the probe needles.

Each of the probe needles is typically mounted on a corresponding needle mount block that is engaged by a corresponding needle drive motor and a pinion gear. The teeth of the pinion gear mesh with teeth in the shift block, and the motor is driven to rotate the pinion gear and facilitate travel of the probe needle along a pitch shift channel in the shift block. A micro-precision stepping motor control system interfaces with the needle drive motors of the respective probe needles, and a microprocessor with enabling software interfaces with the stepping motor control system. The desired number of wafer probe needles, as well as the pitch and height of the needles, may be programmed into the microprocessor, which operates the stepping motor control system to actuate the respective needle drive motors and the block adjusting motor in order to facilitate the desired number, pitch, and height parameters for the particular integrated circuit to be tested.

BRIEF DESCRIPTION OF THE DRAWINGS

The invention will now be described, by way of example, with reference to the accompanying drawings, in which.

DESCRIPTION OF THE PREFERRED EMBODIMENTS

Figure 1:
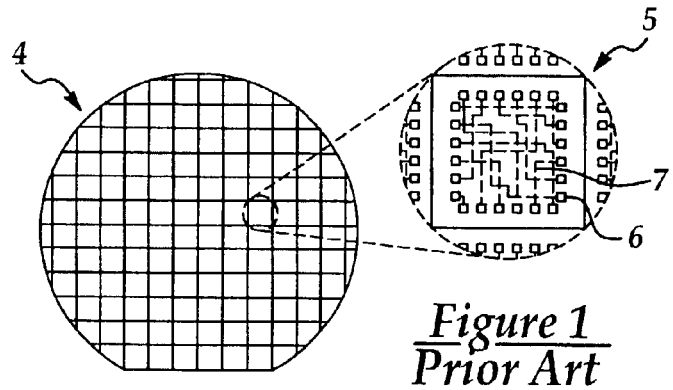
FIG. 1 is a schematic view illustrating a wafer with multiple integrated circuits, or die, fabricated thereon and one of the die on the wafer enlarged to show various components thereof.
Figure 2:
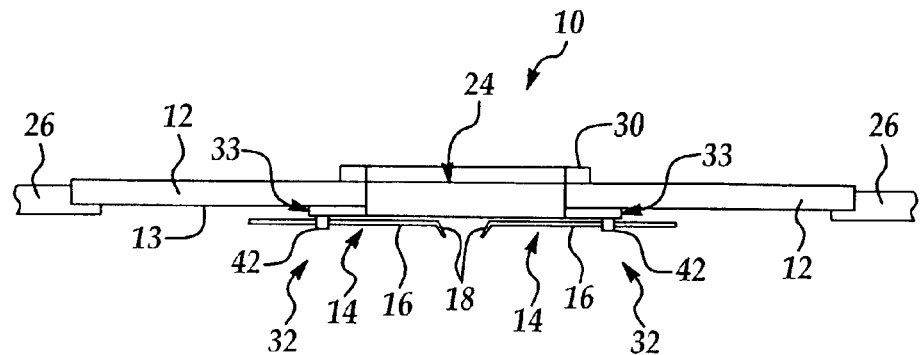
FIG. 2 is a cross-sectional view of a wafer probe card of the present invention.

Referring initially to FIGS. 2–8B, the present invention relates to a wafer probe card 10 having multiple probe needles 14, the number, pitch and height of which may be automatically adjusted to make electrical contact with elements on a microelectronic device such as an integrated circuit, depending on the particular testkey configuration of the device to be tested. The probe needle configuration of the wafer probe card 10 can be quickly and automatically changed for testing of successive devices having different testkey configurations, as hereinafter described. As shown in FIG. 2, the probe card 10 generally includes a planar board 12 having a central opening or cut-out 24 therein which is typically square or rectangular in shape. The board 12 may be formed of conventional printed circuit board materials, as well as other suitable materials which are electrically insulative. The probe card board 12 fits within and is supported on a stage 26 which is vertically movable relative to the electrical device (not shown) to be tested, as is known by those skilled in the art. The board 12 may be provided with a stiffener 30 which is secured to the upper surface of the board 12 and surrounds the opening 24. The stiffener 30 aids in reducing deflection of the board 12, and thus, imparts additional stability to the probe card 10.

Figure 3:
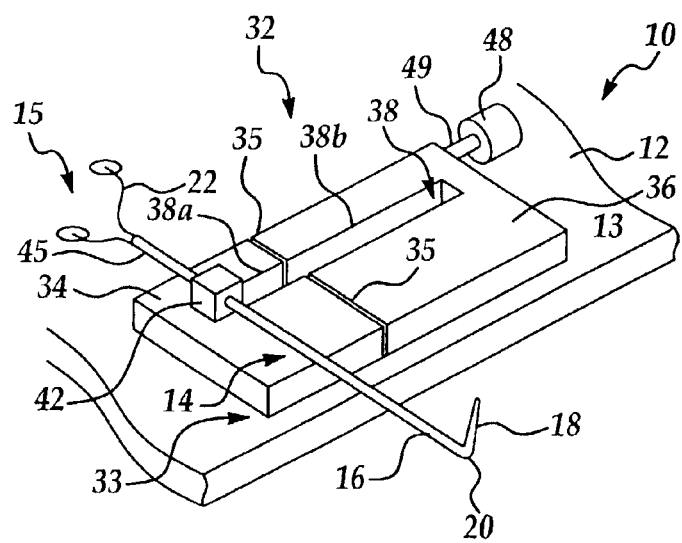
FIG. 3 is a bottom perspective view of the wafer probe card, partially in section, illustrating a pitch shift assembly in implementation of the present invention.
Figure 6:
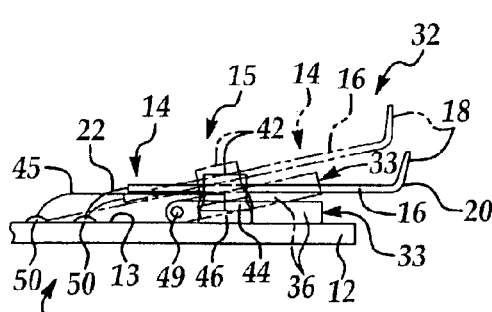
FIG. 6 is a side view of the pitch shift assembly, showing alternative heights of probe needles in implementation of the present invention.
Figure 8A:
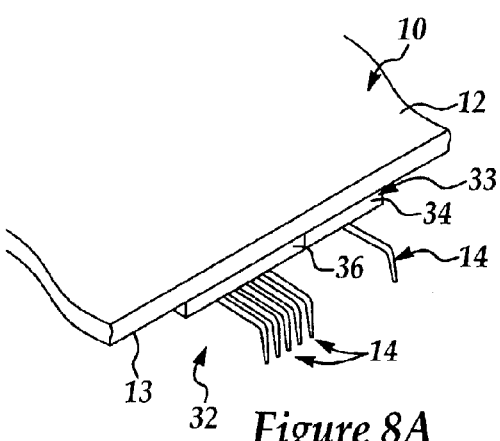
FIG. 8A is a top perspective view of the wafer probe card, illustrating selection of five probe needles in another application of the present invention.
Figure 8B:
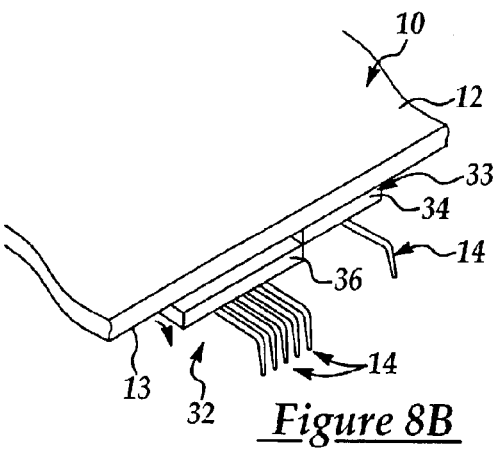
FIG. 8B is a top perspective view of the wafer probe card, with the functional needle block element of the invention pivoted away from the plane of the wafer probe card to achieve a selected height of the probe needles.

In accordance with the present invention, multiple pitch shift assemblies 32, the details of each of which are shown in FIG. 3, are provided on the bottom surface 13 of the board 12, along the respective edges of the square or rectangular central opening 24. Each pitch shift assembly 32 includes an elongated shift block 33 that is mounted on the bottom surface 13 of the board 12 and extends along the corresponding edge of the central opening 24. The shift block 33 of each shift pitch assembly 32 is divided into a reserve needle block 34 and an adjacent functional needle block 36 which is separated from the reserve needle block 34 at a separation line 35. As shown in FIGS. 6 and 8B, the rear edge of the functional needle block 36 is pivotally mounted on the bottom surface 13 of the board 12, whereas the reserve needle block 34 is fixed or non-pivotal with respect to the board 12. As shown in FIG. 3, a block adjusting motor 48 which is typically mounted on the bottom surface 13 engages a motor shaft 49 that engages the functional needle block 36 for selectively pivoting the functional needle block 36 at selected angles with respect to the plane of the board 12, for purposes which will be hereinafter described.

An elongated pitch shift channel or track 38 is provided in the shift block 33, along both the reserve needle block 34 and the functional needle block 36. Accordingly, the pitch shift track 38 includes a reserve needle block portion 38a that extends along the reserve needle block 34 and a functional needle block portion 38b that extends along the functional needle block 36. Each of the probe needles 14 is mounted for selective individual positional adjustment along the pitch shift track 38, as hereinafter described. While only one of the probe needles 14 is shown in FIG. 3 for clarity, it is understood that as many as thirty-two (32), or more as desired, of the probe needles 14 may be mounted along the reserve needle block portion 38a of the pitch shift track 38 such that a selected number of the probe needles 14 may be moved from the reserve needle block portion 38a to the functional needle block portion 38b of the pitch shift track 38, in the manner hereinafter described. Each of the probe needles 14 is a component part of a corresponding one of multiple needle assemblies 15 which are mounted on the shift block 33 in the following manner.

Figure 4:
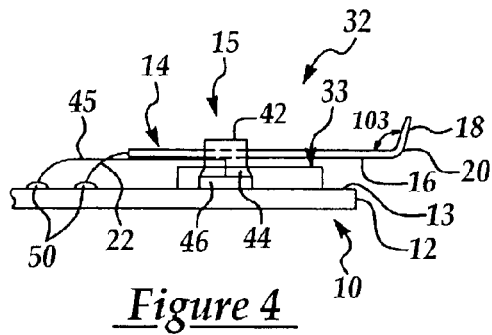
FIG. 4 is a side view of the pitch shift assembly, with the probe card shown in cross-section.
Figure 5:
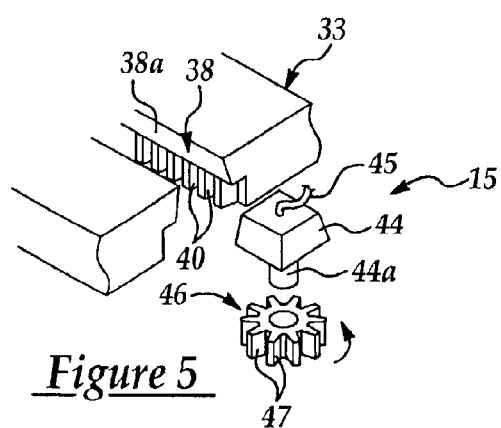
FIG. 5 is an exploded, perspective view, partially in section, illustrating a preferred pinion gear mechanism for facilitating travel of each probe needle along the wafer probe card.

Each needle assembly 15 includes a needle mount block 42 which may be epoxy or other suitable electrically insulative material. The probe needle 14 includes an elongated main leg 16 which extends through the needle mount block 42 and a leg extension 18 which extends from the main leg 16 at an angle of typically from about 103 to about 107 degrees at a needle bend 20, as is known by those skilled in the art and shown in FIG. 4. An electric needle drive motor 44, having a drive shaft 44a, is provided on the needle mount block 42. A pinion gear 46, having multiple gear teeth 47, is mounted on the drive shaft 44a. As shown in FIG. 5, multiple track teeth 40 are provided in the shift block 33, on one or both sides of the pitch shift track 38. The multiple gear teeth 47 of the pinion gear 46 mesh with the track teeth 40, whereas the needle drive motor 44 occupies the non-toothed portion 38a of the pitch shift track 38. As shown in FIG. 4, motor wiring 45 runs from the needle drive motor 44 and typically extends through the board 12 at a wiring boss 50, to the control system for the needle drive motor 44 as hereinafter described. Accordingly, by operation of each of the needle drive motors 44, the respective probe needles 14 are capable of bidirectional travel along the pitch shift track 38, between the reserve needle block 34 and the functional needle block 36, as each needle drive motor 44 causes clockwise or counterclockwise rotation of the corresponding pinion gear 46 and the gear teeth 47 progressively mesh with the track teeth 40. Needle wiring 22 runs from the proximal end of the main leg 16 of each probe needle 14 and typically extends through the board 12 at a wiring boss 50, to the wafer testing instrumentation according to the knowledge of those skilled in the art.

Figure 9:
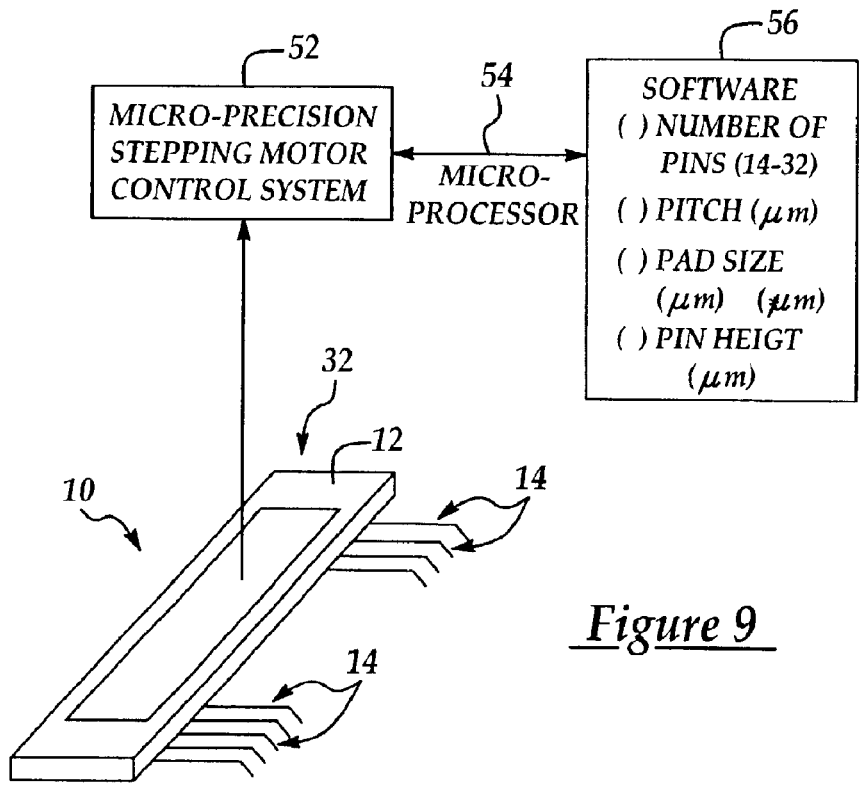
FIG. 9 is a schematic illustrating typical control components for the automatically adjustable wafer probe card of the present invention.

Referring next to the schematic of FIG. 9, the block adjusting motor 48 (FIG. 3) and the multiple needle drive motors 44 (FIG. 5) of each pitch shift assembly 32 on the wafer probe card 10 each interfaces with a micro-precision stepping motor control system 52, which in turn interfaces with a microprocessor 54 with enabling software 56. The motor wiring 45 connects each of the needle drive motors 44 to the appropriate components of the stepping motor control system 52. Accordingly, the microprocessor 54 can be programmed to select the number, pitch and height of wafer probe needles 14 on each shift block 33 to be used in testing a device on a wafer, as well as the pad size or dimensions of the contact pad on the integrated circuit to be engaged by each of the probe needles 14. The microprocessor 54 relays this data to the control system 52, which actuates the needle drive motors 44 of the respective probe needles 14 to be used in the testing process to move those probe needles 14 from the reserve needle block 34 to the functional needle block 36 and to achieve a spacing between the probe needles 14 that corresponds to the pitch programmed into the microprocessor 54, as hereinafter further described.

Figure 7:
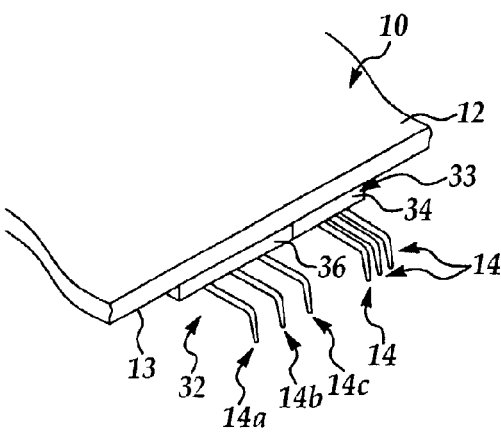
FIG. 7 is a top perspective view of the wafer probe card, illustrating selection of three probe needles in one application of the present invention.
Figure 10:
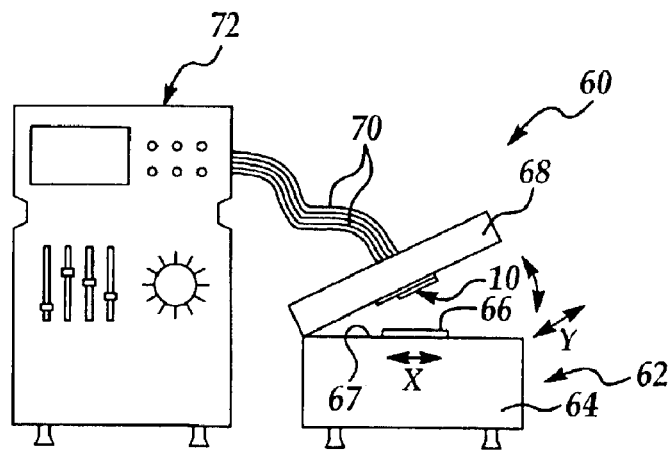
FIG. 10 is a schematic view of a wafer testing unit connected to tester instrumentation during the testing of integrated circuits on a wafer in implementation of the present invention.
Figure 11:
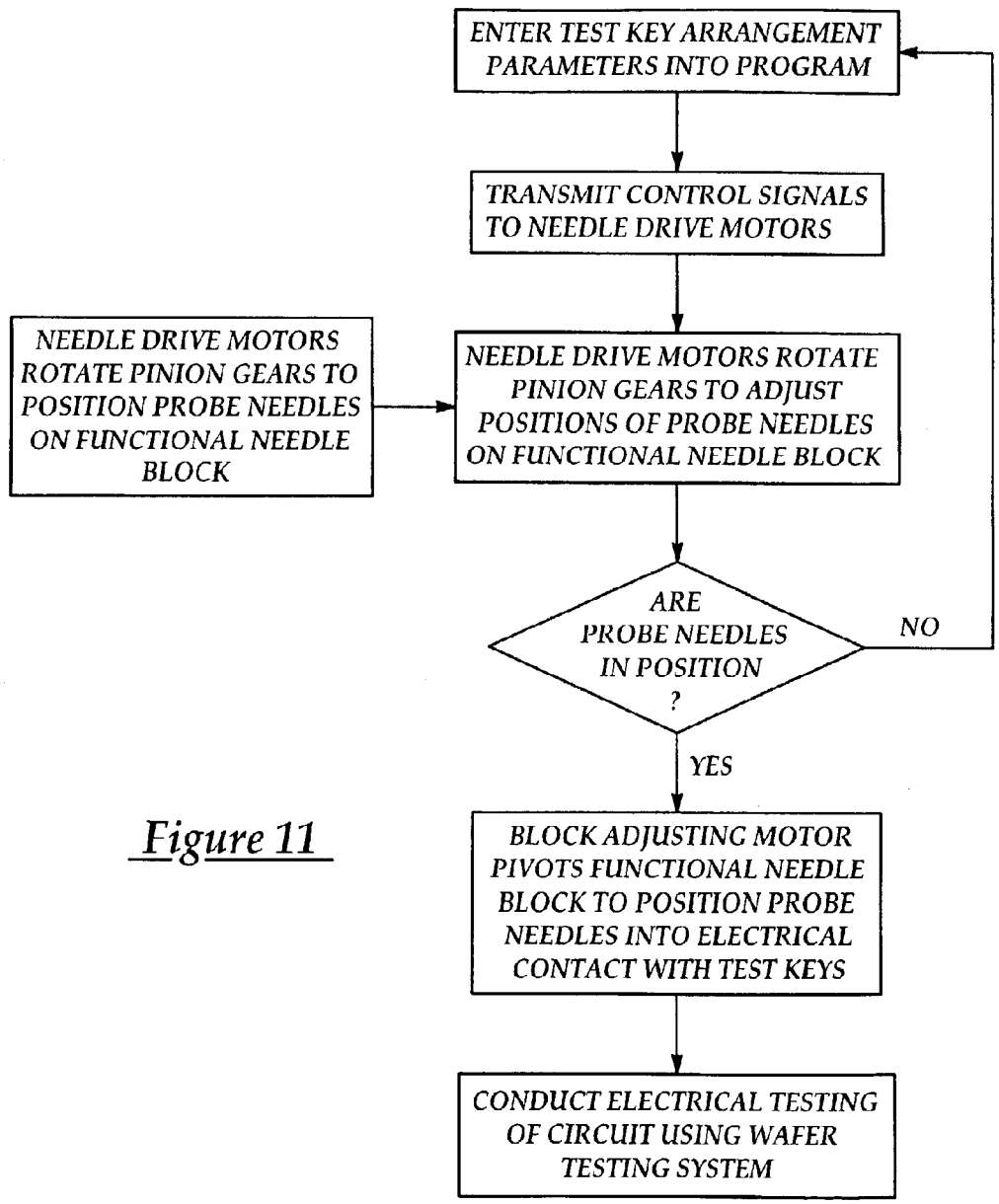
FIG. 11 is a flow diagram illustrating a typical operational method for the automatically adjusting wafer probe card in implementation of the present invention.

Referring next to FIGS. 9–11, the probe card 10 is used in conjunction with a conventional wafer testing system 60 for the testing of integrated circuits (not shown) fabricated on a semiconductor wafer 66. The wafer testing system 60 includes a testing unit 62, having a base 64 and a lid 68 hingedly attached thereto. Wiring 70 connects the testing components of the lid 68 to tester instrumentation 72 which interprets and displays the electrical data obtained during the testing process, in conventional fashion. The wafer 66 is mounted on a wafer support 67 on the base 64, whereas the probe card 10 is installed on the inner surface of the lid 68, with the needle wiring 22 (FIGS. 4 and 6) connected to the appropriate electrical contact elements of the lid 68. Accordingly, the microprocessor 54 can be programmed to select the number, pitch and height of wafer probe needles 14 to be used in testing a device on a wafer, as well as the pad size or dimensions of the contact pad on the integrated circuit to be engaged by each of the respective probe needles 14. After this data is programmed into the microprocessor 54, the microprocessor 54 operates the control system 52 to actuate the needle drive motors 44 of the respective probe needles 14 to be used in the IC testing process, as well as the block adjusting motor 48. In the example shown in FIG. 7, a total of six probe needles 14, 14a–14c are provided on each of the shift blocks 33 of the wafer probe card 10 for brevity, although the number of probe needles 14 may be as large as 32 or more, as desired. In the example of FIG. 7, three of the probe needles 14a–14c are used to contact three respective contact pads (not shown) that are spaced along one side of the integrated circuit for testing of the circuit. The probe needles 14a–14c, normally positioned on the reserve needle block 34 as is shown with respect to the remaining probe needles 14, must be moved from the reserve needle block 34 to the functional needle block 36, as shown, prior to testing of the circuits. In that case, the number of probe needles programmed into the microprocessor 54 is "3", and the distance between the respective contact pads on the integrated circuit, for example, 50 μm, is programmed into the microprocessor 54. Accordingly, the microprocessor 54 relays this information to the control system 52, which actuates the needle drive motor 44 of each of the three probe needles 14a–14c to move the corresponding probe needle from the reserve needle block 34 to the functional needle block 36. When the first probe needle 14a reaches the farthest position on the functional needle block 36, the control system 52 terminates operation of the needle drive motor 44 of the first probe needle 14a to terminate further travel of the first probe needle 14a along the functional needle block 36. Meanwhile, the second probe needle 14b continues to travel toward the first probe needle 14a until the second probe needle 14b is located at the programmed pitch, or distance from the first probe needle 14a, in this case, 50 µm. At that point, the control system 52 in like manner terminates operation of the needle drive motor 44 of the second probe needle 14b, to terminate further travel of the second probe needle 14b along the functional needle block 36. Finally, the third probe needle 14c continues to travel toward the second probe needle 14b until the third probe needle 14c is located at the programmed pitch distance from the second probe needle 14b, at which point the control system 52 terminates operation of the needle drive motor 44 of the third probe needle 14c to terminate further travel of the third probe needle 14c along the functional needle block 36. Once the probe needles 14a–14c are located on the functional needle block 36, the control system 52 may adjust the positions of the probe needles 14a–14c to achieve the final pitch or spacing programmed into the microprocessor 54. The probe needles 14a–14c are thus appropriately spaced for contacting the respective contact pads along the corresponding edge of the integrated circuit. Finally, the stepping motor control system 52, under direction by the microprocessor 54, actuates the block adjusting motor 48 (FIG. 3) to pivot the functional needle block 36 away from the plane of the board 12, as shown by the phantom lines in FIG. 6, in order to facilitate the programmed height of the respective probe needles 14a–14c and lower the probe needles 14a–14c into electrically-conductive contact with the respective contact pads. Accordingly, the block adjusting motor 48 pivots the functional needle block 36 about the motor shaft 49 (FIG. 6) until the probe needles 14a–14c together reach the programmed height (such as 100 µm, for example) and contact the respective contact pads on the circuit, at which point the block adjusting motor 48 terminates further pivoting of the functional needle block 36. Finally, the probe needles 14a–14c are used for testing various electrical parameters of the circuit, in conventional fashion. After the IC testing process is completed, the block adjusting motor 48 may be actuated to return the functional needle block 36 to the flat position of FIG. 4 and the needle drive motors 44 of the respective probe needles 14 to rotate the respective pinion gears 46 in the opposite direction and return the probe needles 14a–14c to the reserve needle block 34. FIGS. 8A and 8B illustrate further examples wherein five of the probe needles 14 are moved from the reserve needle block 34 to the functional needle block 36 for contact with respective contact pads on the circuit. The typical operational steps described herein above are outlined in the flow diagram of FIG. 11.

While the preferred embodiments of the invention have been described above, it will be recognized and understood that various modifications can be made in the invention and the appended claims are intended to cover all such modifications which may fall within the spirit and scope of the invention.

What is claimed is:

1. A wafer probe card for use with a wafer testing system, comprising:
   a board;
   at least one elongated shift block carried by said board; and
   a plurality of probe needles adjustably carried by said at least one shift block for electrical connection to the wafer testing system and selective positional adjustment along said at least one shift block, said shift block comprises a reserve needle block and a functional needle block adjacent to said reserve needle block, and wherein said plurality of probe needles are capable of selective positional adjustment between said reserve needle block and said functional needle block.

2. The wafer probe card of claim 1 further comprising a pitch shift track provided in said shift block and wherein said plurality of probe needles adjustably engage said pitch shift track.

3. The wafer probe card of claim 2 further comprising a plurality of needle drive motors carried by said plurality of probe needles, respectively; a plurality of pinion gears drivingly engaged by said plurality of needle drive motors, respectively; and a plurality of track teeth provided in said shift block along said pitch shift track for engaging said plurality of pinion gears, respectively, and wherein selected ones of said plurality of probe needles travel along said pitch shift track by operation of corresponding ones of said plurality of needle drive motors, respectively.

4. The wafer probe card of claim 3 further comprising a plurality of needle mount blocks carried by said plurality of needle drive motors, respectively, and wherein said plurality of probe needles are carried by said plurality of needle mount blocks, respectively.

5. The wafer probe card of claim 4 wherein said shift block comprises a reserve needle block and a functional needle block adjacent to said reserve needle block, and wherein said plurality of probe needles are capable of selective positional adjustment between said reserve needle block and said functional needle block.

6. The wafer probe card of claim 1 wherein said functional needle block is pivotally carried by said board and further comprising a block adjusting motor operably engaging said functional needle block for selectively pivoting said functional needle block with respect to said board.

7. The wafer probe card of claim 6 further comprising a pitch shift track provided in said shift block and wherein said plurality of probe needles adjustably engage said pitch shift track.

8. The wafer probe card of claim 1 wherein said functional needle block is pivotally carried by said board and further comprising a block adjusting motor operably engaging said functional needle block for selectively pivoting said functional needle block with respect to said board.

9. The wafer probe card of claim 8 further comprising a plurality of needle mount blocks carried by said plurality of needle drive motors, respectively, and wherein said plurality of probe needles are carried by said plurality of needle mount blocks, respectively.

10. A wafer probe card for use with a wafer testing system, comprising:
    a board;
    at least one elongated shift block carried by said board;
    a plurality of probe needles adjustably carried by said at least one shift block for electrical connection to the wafer testing system; and
    a control system operably connected to said plurality of probe needles for adjusting positions of selected ones of said plurality of probe needles along said at least one shift block.

11. The wafer probe card of claim 10 wherein said shift block comprises a reserve needle block and a functional needle block adjacent to said reserve needle block, and wherein said plurality of probe needles are capable of selective positional adjustment between said reserve needle block and said functional needle block.

12. The wafer probe card of claim 11 wherein said functional needle block is pivotally carried by said board and further comprising a block adjusting motor operably engaging said functional needle block for selectively pivoting said functional needle block with respect to said board.

13. A wafer probe card for use with a wafer testing system, comprising:

a board;

at least one elongated shift block having an elongated pitch shift track carried by said board;

a plurality of probe needles adjustably carried by said at least one shift block for electrical connection to the wafer testing system and positional adjustment along said pitch shift track; and a control system operably connected to said plurality of probe needles for adjusting positions of selected ones of said plurality of probe needles along said pitch shift track.

14. The wafer probe card of claim 13 wherein said shift block comprises a reserve needle block and a functional needle block adjacent to said reserve needle block, and wherein said plurality of probe needles are capable of selective positional adjustment between said reserve needle block and said functional needle block.

15. The wafer probe card of claim 14 wherein said functional needle block is pivotally carried by said board and further comprising a block adjusting motor operably engaging said functional needle block for selectively pivoting said functional needle block with respect to said board.

16. The wafer probe card of claim 13 further comprising a plurality of needle drive motors carried by said plurality of probe needles, respectively; a plurality of pinion gears drivingly engaged by said plurality of needle drive motors, respectively; and a plurality of track teeth provided in said shift block along said pitch shift track for engaging said plurality of pinion gears, respectively, and wherein selected ones of said plurality of probe needles travel along said pitch shift track by operation of corresponding ones of said plurality of needle drive motors, respectively.

17. The wafer probe card of claim 16 further comprising a plurality of needle mount blocks carried by said plurality of needle drive motors, respectively, and wherein said plurality of probe needles are carried by said plurality of needle mount blocks, respectively.

* * * * *